US011411555B2

(12) United States Patent
Lim et al.

(10) Patent No.: US 11,411,555 B2
(45) Date of Patent: *Aug. 9, 2022

(54) HIGH SPEED DIGITAL PHASE INTERPOLATOR WITH DUTY CYCLE CORRECTION CIRCUITRY

(71) Applicant: Intel Corporation, Santa Clara, CA (US)

(72) Inventors: Ee Wah Lim, Simpang Ampat (MY); Lay Leng Lim, Jelutong (MY)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/395,353

(22) Filed: Aug. 5, 2021

(65) Prior Publication Data

US 2021/0367588 A1 Nov. 25, 2021

Related U.S. Application Data

(63) Continuation of application No. 16/221,392, filed on Dec. 14, 2018, now Pat. No. 11,088,682.

(51) Int. Cl.

*H03K 5/156* (2006.01)
*H03K 5/14* (2014.01)
*H03L 7/081* (2006.01)

(52) U.S. Cl.

CPC ............. *H03K 5/1565* (2013.01); *H03K 5/14* (2013.01); *H03L 7/0814* (2013.01)

(58) Field of Classification Search

CPC ...... H03K 5/1565; H03K 5/14; H03L 7/0814; H03L 7/0816; H03L 7/0818; H03L 7/0812

USPC .......................................................... 327/175

See application file for complete search history.

(56) References Cited

U.S. PATENT DOCUMENTS

| | | | | |
|---|---|---|---|---|
| 7,363,563 | B1 | 4/2008 | Hissen et al. | |
| 9,503,066 | B2 | 11/2016 | Ma | |
| 9,590,640 | B1 * | 3/2017 | Hsieh | H03L 7/1075 |
| 11,088,682 | B2 * | 8/2021 | Lim | H03K 5/1565 |
| 2005/0180536 | A1 | 8/2005 | Payne et al. | |
| 2008/0042716 | A1 | 2/2008 | Lee | |
| 2009/0116602 | A1 | 5/2009 | Kwon et al. | |

(Continued)

OTHER PUBLICATIONS

International Patent Office—International Search Report and Written Opinion from International Application No. PCT/US2019/061015 dated Apr. 9, 2020, 12 pages.

(Continued)

*Primary Examiner* — Metasebia T Retebo

(74) *Attorney, Agent, or Firm* — Schwabe, Williamson & Wyatt, P.C.

(57) ABSTRACT

Described is a circuit and architecture that combines phase interpolator (PI) mixer with duty cycle correction (DCC), to prevent cross contention between the tristate inverter pairs of the mixer. The control code for the p-type and n-type networks in the PI mixer are decoupled, and DCC mechanism are blended in the PI mixer code decoding scheme to enable a low latency phase interpolation and duty cycle correction. The circuit comprises a first mixer circuitry controllable by a first code; a second mixer circuitry controllable by a second code; a node coupled to outputs of the first and second mixers; and a keeper circuitry coupled to the node, wherein the first and second mixers are tri-stable mixers.

25 Claims, 13 Drawing Sheets

(56) References Cited

U.S. PATENT DOCUMENTS

| | | | |
|---|---|---|---|
| 2011/0187907 | A1 | 8/2011 | Takahashi |
| 2012/0306552 | A1 | 12/2012 | Erdogan |
| 2012/0326750 | A1 | 12/2012 | Yong |
| 2014/0321577 | A1 | 10/2014 | Kuttner |
| 2015/0008968 | A1 | 1/2015 | Ma |
| 2017/0149422 | A1 | 5/2017 | Ma |
| 2018/0167143 | A1 | 6/2018 | Yao et al. |

OTHER PUBLICATIONS

United States Patent Office—Office Action dated Nov. 14, 2019 from U.S. Appl. No. 16/221,392, 14 pages.
United States Patent Office—Final Office Action dated May 29, 2020 from U.S. Appl. No. 16/221,392, 13 pages.
United States Patent Office—Advisory Action dated Aug. 19, 2020 from U.S. Appl. No. 16/221,392, 4 pages.
United States Patent Office—Office Action dated Oct. 6, 2020 from U.S. Appl. No. 16/221,392, 9 pages.
United States Patent Office—Notice of Allowance dated Apr. 14, 2021 from U.S. Appl. No. 16/221,392, 7 pages.

* cited by examiner

404a

| PI Code | | | OddClock | Mux Selector | | | |
|---|---|---|---|---|---|---|---|
| [7] | [6] | [5] | | [3] | [2] | [1] | [0] |
| 0 | 0 | 0 | 45 | 0 | 0 | 0 | 1 |
| 0 | 0 | 1 | 45 | 0 | 0 | 0 | 1 |
| 0 | 1 | 0 | 135 | 0 | 0 | 1 | 0 |
| 0 | 1 | 1 | 135 | 0 | 0 | 1 | 0 |
| 1 | 0 | 0 | 225 | 0 | 1 | 0 | 0 |
| 1 | 0 | 1 | 225 | 0 | 1 | 0 | 0 |
| 1 | 1 | 0 | 315 | 1 | 0 | 0 | 0 |
| 1 | 1 | 1 | 315 | 1 | 0 | 0 | 0 |

405a

| PI Code | | | EvenClock | Mux Selector | | | |
|---|---|---|---|---|---|---|---|
| [7] | [6] | [5] | | [3] | [2] | [1] | [0] |
| 0 | 0 | 0 | 0 | 0 | 0 | 0 | 1 |
| 0 | 0 | 1 | 90 | 0 | 0 | 1 | 0 |
| 0 | 1 | 0 | 90 | 0 | 0 | 1 | 0 |
| 0 | 1 | 1 | 180 | 0 | 1 | 0 | 0 |
| 1 | 0 | 0 | 180 | 0 | 1 | 0 | 0 |
| 1 | 0 | 1 | 270 | 1 | 0 | 0 | 0 |
| 1 | 1 | 0 | 270 | 1 | 0 | 0 | 0 |
| 1 | 1 | 1 | 0 | 0 | 0 | 0 | 1 |

| PI Code [7] | [6] | [5] | EvenClock | Mux Selector [3] | [2] | [1] | [0] |
|---|---|---|---|---|---|---|---|
| 0 | 0 | 0 | 0 | 0 | 0 | 0 | 1 |
| 0 | 0 | 1 | 90 | 0 | 0 | 1 | 0 |
| 0 | 1 | 0 | 90 | 0 | 0 | 1 | 0 |
| 0 | 1 | 1 | 180 | 0 | 1 | 0 | 0 |
| 1 | 0 | 0 | 180 | 0 | 1 | 0 | 0 |
| 1 | 0 | 1 | 270 | 1 | 0 | 0 | 0 |
| 1 | 1 | 0 | 270 | 1 | 0 | 0 | 0 |
| 1 | 1 | 1 | 0 | 0 | 0 | 0 | 1 |

| PI Code [7] | [6] | [5] | OddClock | Mux Selector [3] | [2] | [1] | [0] |
|---|---|---|---|---|---|---|---|
| 0 | 0 | 0 | 45 | 0 | 0 | 0 | 1 |
| 0 | 0 | 1 | 45 | 0 | 0 | 0 | 1 |
| 0 | 1 | 0 | 135 | 0 | 0 | 1 | 0 |
| 0 | 1 | 1 | 135 | 0 | 0 | 1 | 0 |
| 1 | 0 | 0 | 225 | 0 | 1 | 0 | 0 |
| 1 | 0 | 1 | 225 | 0 | 1 | 0 | 0 |
| 1 | 1 | 0 | 315 | 1 | 0 | 0 | 0 |
| 1 | 1 | 1 | 315 | 1 | 0 | 0 | 0 |

HIGH SPEED DIGITAL PHASE INTERPOLATOR WITH DUTY CYCLE CORRECTION CIRCUITRY

RELATED APPLICATIONS

This application is a continuation of U.S. patent application Ser. No. 16/221,392, entitled "HIGH SPEED DIGITAL PHASE INTERPOLATOR WITH DUTY CYCLE CORRECTION CIRCUITRY" filed on Dec. 14, 2018, and claims priority to the Ser. No. 16/221,392 application. The entire contents of the Ser. No. 16/221,392 application is incorporated herein by reference.

BACKGROUND

In high speed serial links, clock data recover (CDR) is a mechanism to extract sampling clock from a serial data stream. The extracted clock is finely phase-shifted toward an eye center of the data stream to achieve the best bit data error (BER). This phase-shift is usually done by a weighted sum of two clocks that are same in frequency but are separated by a known phase difference e.g. 45°, 90°, etc. For Giga-Hz (GHz) high speed links, the extracted sampling clock has to meet strict requirements in term of linearity, granulation, power and latency. Additionally, the duty cycle of the extracted sampling clock has to be close to 50% to enable dual-edge sampling. In this regard, duty cycle correction (DCC) mechanism may be implemented to adjust the transition edges of the sampling clock. DCC range, granularity and latency are the key performance metric of a DCC circuit. It is a challenge to develop a CDR and DCC circuit architecture that meets the above specifications and yet provides low power consumption.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
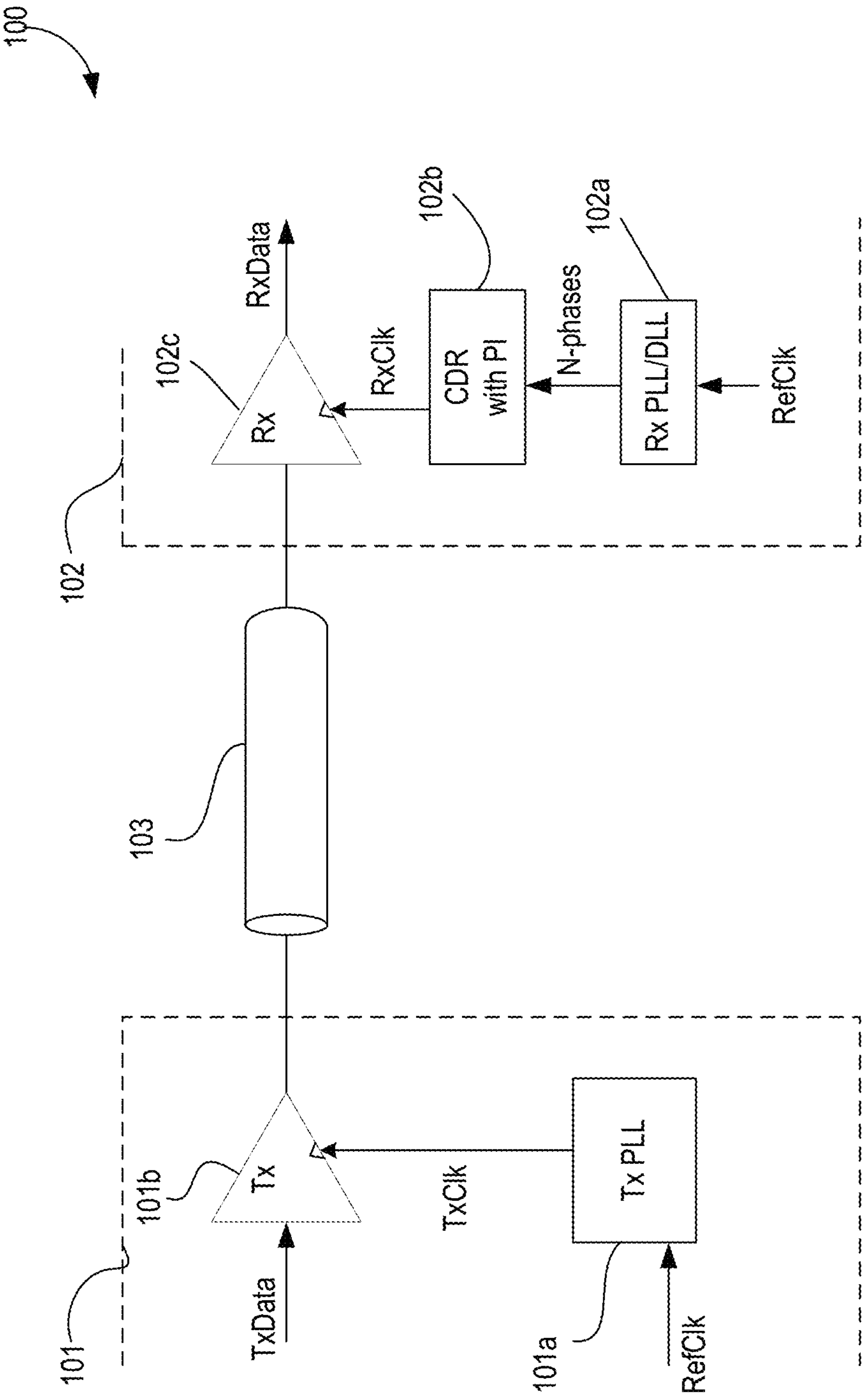
FIG. 1 illustrates a high level architecture of a communication link that employs clock data recovery (CDR) having low power digital phase interpolator (PI) with duty cycle correction (DCC), in accordance with some embodiments of the disclosure.

Some embodiment describe a circuit and architecture that combine phase interpolation (PI) mixer with duty cycle correction (DCC). The combined PI mixer and DCC prevents cross contention between the tristate inverter pairs. In some embodiments, the control code for the p-type and n-type network in the PI mixer are decoupled, and DCC mechanism are blended in the PI mixer code decoding scheme to enable a low latency phase interpolation and duty cycle correction.

There are many technical effects of the various embodiments. For example, the architecture of various embodiments reduces average power consumption (e.g., up to 44%) compared to transitional PI and DDC circuitries that are separate and distinct. The combination or integration of PI and DCC functions reduces clock data recovery (CDR) loop latency. For instance, the CDR loop latency reduces by about 0.5 UI (unit interval). The combination or integration of PI and DCC functions also reduces differential non-linearity (DNL) and integral non-linearity (INL) compared to transitional PI and DDC circuitries that are separate and distinct. For instance, DNL reduces from 2.48× to 0.45×, while INL reduces from 7 ps (picoseconds) to 2.8 ps. The combination or integration of PI and DCC functions increases the range of the DCC compared to transitional PI and DDC circuitries that are separate and distinct. For example, the DCC range increases from 55 ps to 60 ps. With circuitry with combination or integration of PI and DCC functions also reduces aging risk by limiting the short circuit current and eliminating slow duty cycle adjustment (DCA) circuits. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy.

The term "between" may be employed in the context of the z-axis, x-axis or y-axis of a device. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 illustrates a high level architecture 100 of a communication link that employs clock data recovery (CDR) having low power digital phase interpolator (PI) with duty cycle correction (DCC), in accordance with some embodiments of the disclosure. Architecture 100 comprises domain 101 and domain 102, wherein domain 101 is to send a data stream over channel 103 to domain 102. Here, the term domain may refer to any circuit area that is physically separate from another domain such that communication between the two domains may need a clock data recovery (CDR) apparatus in the receiving domain. For example, domain 101 may be a first die and domain 102 may be a second die. In another example, domain 101 may be one area of a first die and domain 102 may be another area of the same die.

Domain 101 may comprise a transmit (Tx) clocking source (e.g., a Tx phase locked loop (PLL)) 101*a* and transmitter (TX). Tx PLL 101*a* may receive a reference clock (RefClk) and generate a phase locked output clock (Tx Clk) for sampling data to be transmitted TxData. The sampled data is then driven by a transmitting driver of Tx 101*b* over channel 103 to a receiver 102*c*. Since clock is not transmitted from domain 101 to domain 102, a CDR is used in domain 102 to produce the clocks to sample the incoming data received by a receiver of domain 102.

In some embodiments, domain 102 comprises a receiver PLL or delay locked loop (DLL) 102*a*, a clock data recovery (CDR) circuitry 102*b*, and receiver 102*c*. The receiver PLL or DLL provides multiple clock phases relative to the phase of a receiver reference clock (RefClk). The N-phases (where 'N' is any number) of clocks are received by CDR 102*b* which includes a phase interpolator and duty cycle correction apparatus. In various embodiments, the PI (or PI mixer) and DCC functions are integrated together to produce a high-speed CDR. The combined PI mixer and DCC prevents cross contention between the tristate inverter pairs. In some embodiments, the control code for the p-type and n-type network in the PI mixer are decoupled, and DCC mechanism are blended in the PI mixer code decoding scheme to enable a low latency phase interpolation and duty cycle correction.

The clocks used for sampling the received data stream generally have a frequency substantially equal to the incoming data rate of the data sent by domain 101. For example, the clocks used for sampling in domain 102 may be 10 GHz for 10 Gb/s data rate, or multiple clocks spaced at 100 ps. In other words, the sampling clocks may have proper phase relationship with the incoming data for sufficient timing margin to achieve a desired bit-error-rate (BER).

In various embodiments, clock frequency and optimum phase position are extracted from incoming data stream. In some embodiments, a phase detection circuitry is used for comparing a sampling clock from a PI with a reference clock. In some embodiment, this reference clock is a filtered data stream itself. For example, data stream filtered for inter-symbol interference (ISI) is used by the phase detector. The phase detector is expected to operate with missing transition edges in the input data sequence. As such, the phase detector of the CDR 102*b* compares the phase between the input data and the recovered clock sampling this data, and provides information (early or late) to adjust the sampling clock's phase.

Figure 2:
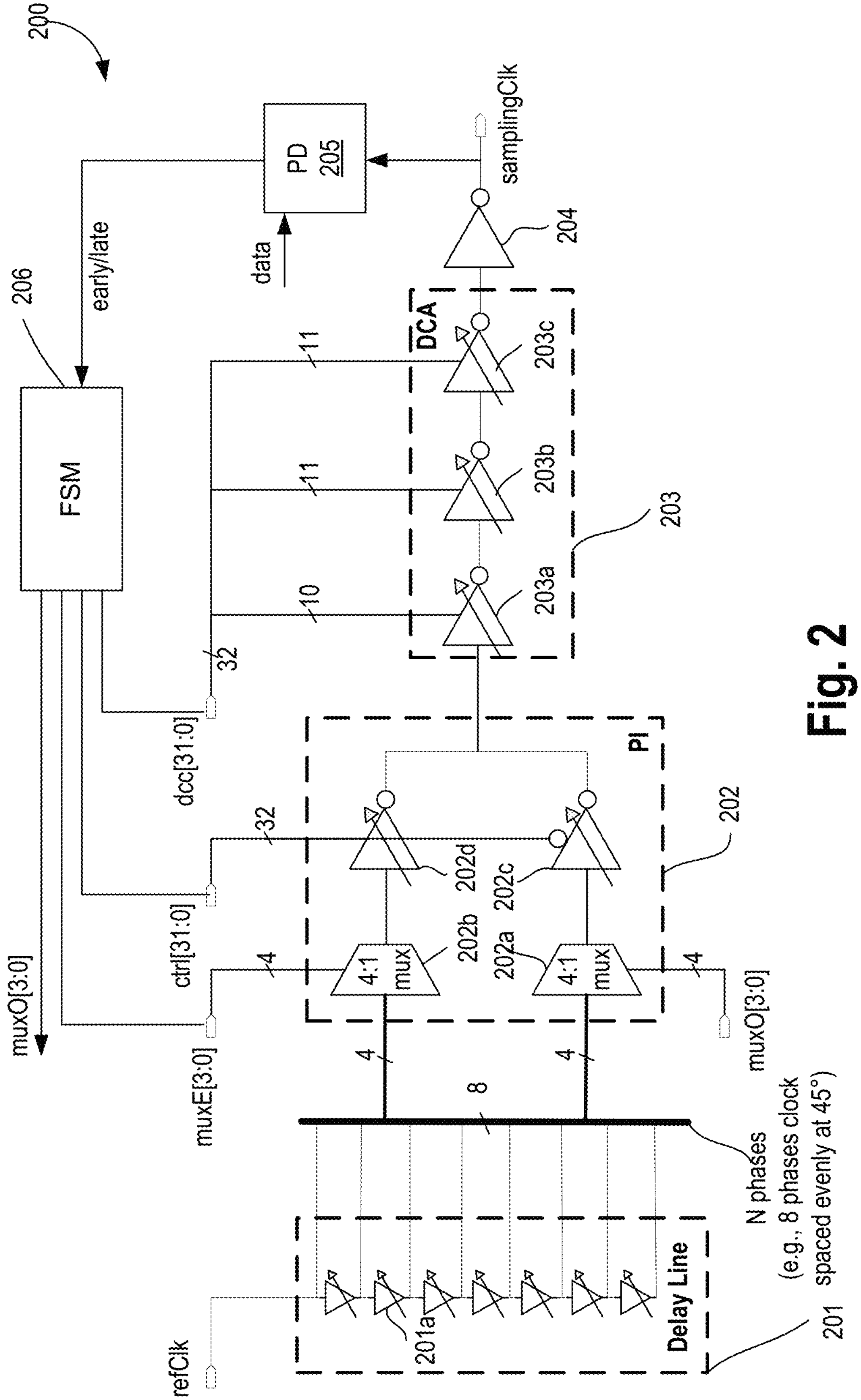
FIG. 2 illustrates a schematic of a CDR with PI separate from a DCC, in accordance with some embodiments.

FIG. 2 illustrates a schematic 100 of a CDR with PI separate from a DCC, in accordance with some embodiments. Schematic 100 comprises a phase generator 201, phase interpolator (PI) 202, a duty cycle adjuster 203, output buffer 204, phase detector 205, and finite state machine 206. The phase generator 201 can be any suitable delay line. In some embodiments, the delay line is part of a voltage controlled oscillator (of a PLL) comprising delay cells, where an output of every delay cells provides a different phase output. In some embodiments, the delay line is a voltage-controlled delay line (VCDL) which is part of a delay locked loop (DLL) and adjusts the delay of each delay cell to a particular propagation delay. The output of each delay cell 201*a* provides a different phase. In this example, seven delay cells 201*a* are shown providing eight different phase clocks spaced evenly at 45 degrees. In some embodiments, the entire delay line 201 is locked to one or have the input clock cycle (here, reference clock).

The N-phase of clocks (e.g., 8 phase clocks) are received by PI 202 which generates a phase interpolated clock. PI 202 realizes a digital-to-phase conversion. It produces an output clock that is a weighted sum of two input clock phases. PI 202 can be realized as tail-current summation interpolation circuitries or voltage-mode interpolation. The mapping technique for the interpolator code can be sinusoidal or linear.

In some embodiments, PI 202 is a digital PI comprises multiplexers 202*a* and 202*b* to receive half of the phases each. For example, multiplexer 202*a* receives the last four phase from the delay line 201 while multiplexer 202*b* receives the first four phases from the delay line 201. Depending upon the number of multiplexers, an arbitrary phase shift can be generated with linear summation of in-phase clock (I-clock) and quadrature-phase clock (Q-clock).

In this example, the multiplexers 202*a/b* are 4:1 multiplexers (muxes) and controllable by their respective control signals. Multiplexer 202*a* is also referred to as the odd mux and is controllable by a 4-bit control signal (muxO[3:0]) while multiplexer 202*b* is referred to as the even mux and is controllable by another 4-bit control signal (muxE;3:0]).

The outputs of the muxes 202*a* and 202*b* are then received by respective mixers 202*c* and 202*d* that interpolate their respective inputs and provide an average or interpolated version of their inputs as output. Two clocks with adjacent phases are selected through multiplexers 202*a* and 202*b* and fed to the PI mixers 202*c* and 202*d* for voltage mode summation and interpolation. In some embodiments, mixers 202*c* and 202*d* comprise current starved inverters. The drive strength of mixers 202*c* and 202*d* are tuned by a complementary thermometer code, crtl and ctrlb. By varying the code, specific weightage of the clocks can be mixed and subsequently an output clock is produced with fine-grained phase shift. The interpolation linearity is generally a function of the phase spacing to output time constant ratio.

The output of PI 202 is then adjusted for duty cycle distortion by DCA 203. In some embodiments, DCA comprises adjustable delay inverters that adjust the rising and/or falling edges of the output of PI 202 to generate a 50% or near 50% duty cycle output. The output of DCA is then buffered by buffer 204 (or inverter 204). The output of buffer 204 is the sampling clock (sampling Clk) which is compared by phase detector (PD) 205 with the input data stream. The input data stream may be filtered for ISI and/or other noises before it is received by PD 205. The output of PD 205 is information (early or late) to adjust the sampling clock's phase.

The phase detectors can be linear or non-linear. Linear phase detectors (e.g., Hogge phase detector) provide both sign and magnitude information regarding the sampling phase error. Non-linear phase detectors merely provide sign information regarding the sampling phase error. Examples of non-linear phase detectors include Alexander, 2×-oversampled, or Band-Bang phase detectors.

The output (early/late) of PD 205 is received by FSM that generates the control signals muxE, ctrl, dcc, and muxO to adjust the phase and transition edges of samplingClk till the sampling edge of SamplingClk is in the center of the data eye. In this example, muxE and muxO are 4-bit signals, ctrl is a 32-bit signal, and dcc is a 32 bit signal.

Figure 3:
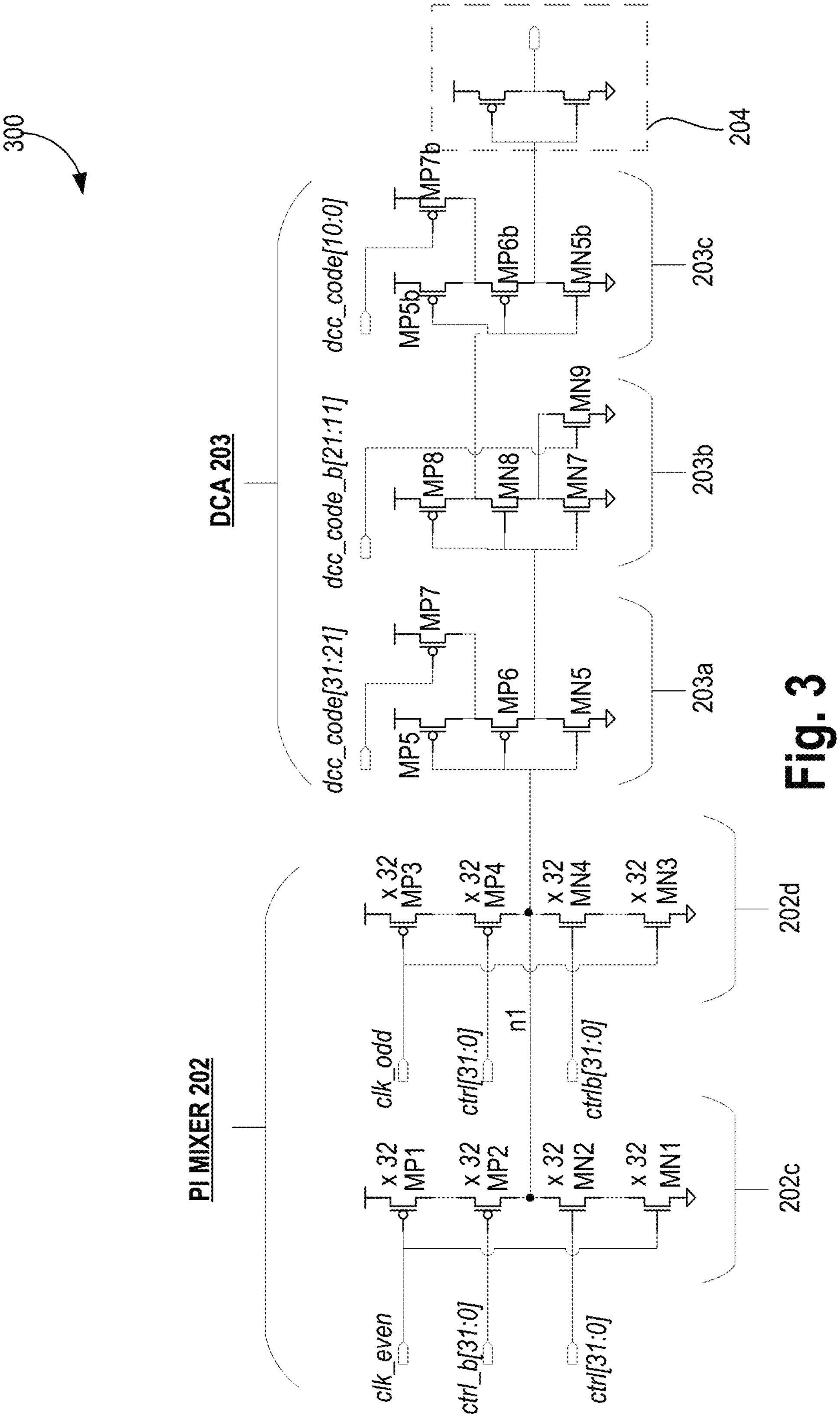
FIG. 3 illustrates a schematic of a PI and a DCC used in FIG. 2, in accordance with some embodiments.

FIG. 3 illustrates a schematic 300 of a PI 202 and a DCA 203 used in FIG. 2, in accordance with some embodiments. PI mixer 202 comprises the odd mixer 202*c* and even mixer 202*d*. In this example, 32 copies of odd mixer 202*c* and even mixer 202*d* are provided. Odd mixer 202*c* comprises p-type transistors MP1 and MP2, and n-type transistor MN1 and MN2 coupled together as shown. Even mixer 202*c* comprises p-type transistors MP3 and MP4, and n-type transistor MN3 and MN4 coupled together as shown. The output of the inverters is a common node which is received by DCA 203. DCA 203 comprises three inverters 203*a*, 203*b*, and 203*c* with tunable delay on one of the transition edge. Inverter 203*a* comprises p-type transistors MP5, MP6, and MP7, and n-type transistor MN5 coupled together as shown. Transistor MP7 is controllable by dcc_code (e.g., dcc_code[31:21]). Inverter 203*b* comprises p-type transistor MP8, and n-type transistors MN7, MN8, and MN9, coupled together as shown. Transistor MN9 is controllable by dcc_code_b (e.g., dcc_code_b[21:11]). Inverter 203*c* comprises p-type transistors MP5*b*, MP6*b*, and MP7*b*, and n-type transistor MN5*b* coupled together as shown. Transistor MP7*b* is controllable by dcc_code (e.g., dcc_code[10:0]). In various embodiments, the suffix 'b' for a control signal or clock signal indicates an inverse or complementary signal of a corresponding control signal or clock signal.

Figure 4:
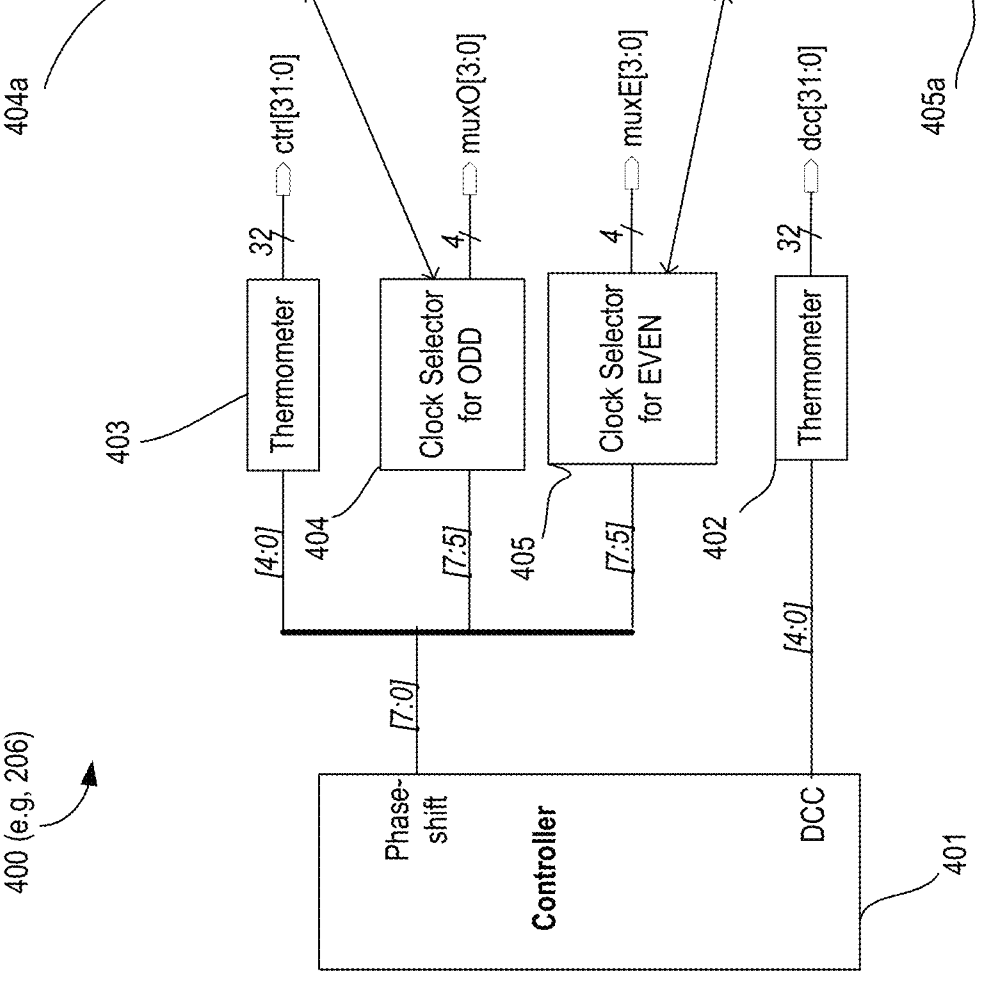
FIG. 4 illustrates a portion of a finite state machine (FSM) that generates control codes for PI, DCC, and multiplexer(s) of the CDR of FIG. 2, in accordance with some embodiments.

FIG. 4 illustrates a portion 400 of a finite state machine (FSM) that generates control codes for PI, DCC, and multiplexer(s) of the CDR of FIG. 2, in accordance with some embodiments. Portion 400 comprises a controller 401, binary to thermometer decoders 402 and 403, and clock selector 404 for odd mux and clock selector 405 for even mux. In some embodiments, clock selectors 404 and 405 implement one-hot encoders that provides one-hot signals muxO and muxE from the most significant bits (MSBs) of the PI code) e.g., code [7:0]). In some embodiments, the PI mixer codes (e.g., thermometer code ctrl) is decoded from the least significant bit (LSB) of the Pi code. In some embodiments, the DCA code (e.g., dcc) is decoded from LSB of the DCC binary code (e.g., code [4:0]). The tables 404*a* and 405*a* illustrates the decoding pattern (or truth table) for MuxO and MuxE, respectively, for the given code. Any person skilled in the art can implement the hardware for the tables 404*a* and 405*a*.

Figure 5:
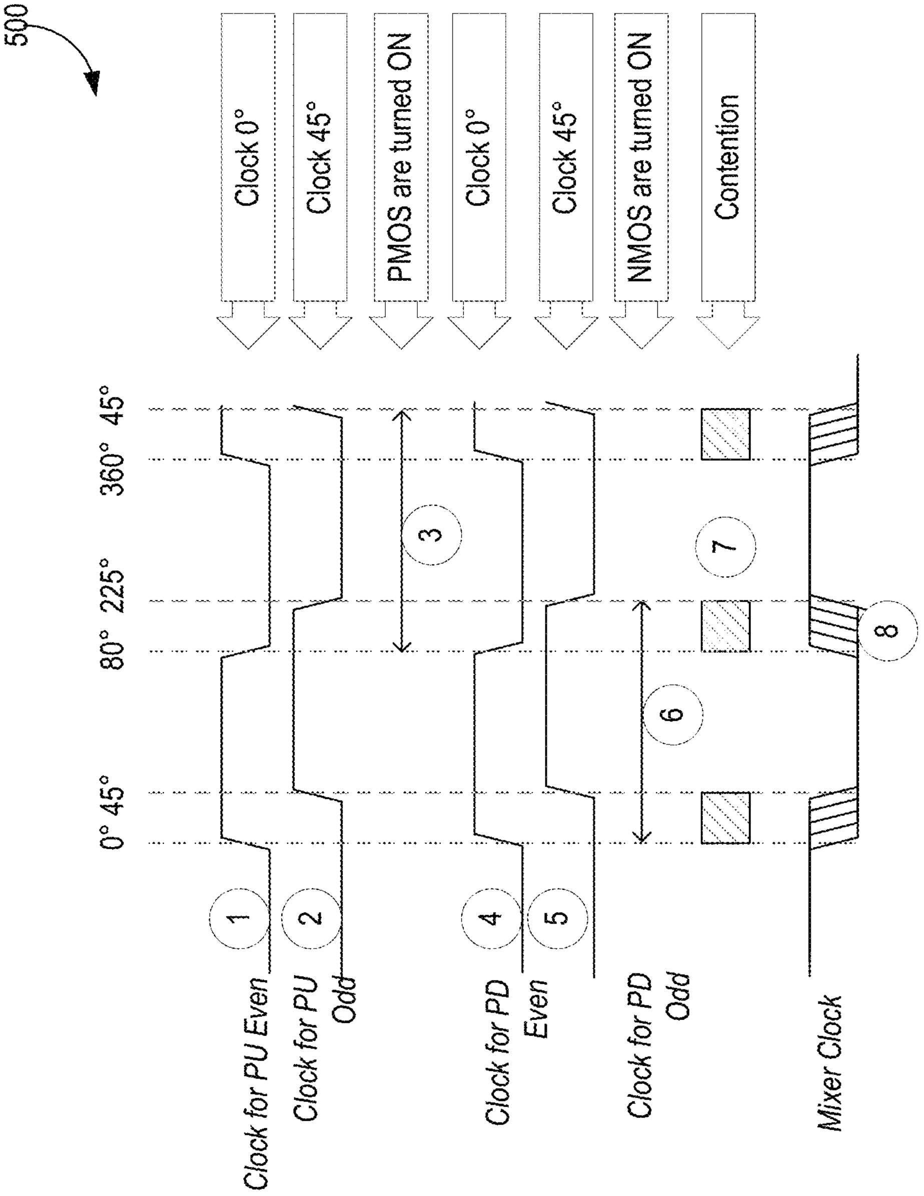
FIG. 5 illustrates a timing diagram of the operation of the CDR of FIG. 2, in accordance with some embodiments.

FIG. 5 illustrates a timing diagram 500 of the operation of the CDR of FIG. 2, in accordance with some embodiments. The operation of the PI mixers 202*c/d* are illustrated in the timing diagram 500. At label (1), the pull-up network for even PI mixer 202*c* is driven by clock with 0 phase (clock 0). The pull-up network for the even PI mixer 202*c* comprises transistor MP1. At block (2), the pull-up network for off PI mixer 202*d* is driven by clock with 45 phase (clock 45). The pull-up network for the even PI mixer 202*d* comprises transistor MP3. At label (3), at least one p-type device in the pull-up network is turned on. As such, mixer node n1 is pulled-up to 1. For example, p-type device MP2 of PI mixer 202*c* is turned on by ctrl_b.

At label (4), pull-down network for even PI mixer 202*d* is driven by the same clock 0. Pull-down network comprises transistor MN1. At label (5), pull-down network for odd PI mixer 202*c* is driven by the same clock 45. At label (6), at last one n-type device (e.g., MN2) in the pull-down mixer 202*c/d* is turned ON, causing the mixer node n1 to be pulled-down to '0'. At label (7), both pull-up and pull-down networks of one of PI mixers 202*c/d* are turned ON. As such, short circuit current flows through the pull-up and pull-down network. At label (8), raising and falling transitions at the mixer node n1 are adjusted based on weightage of the mixer.

Here, both pull-down and pull-up network are activated for ⅝ cycle respectively. Thus, the short circuit current flows through the PI mixer 202*c/d* for at least ¼ of every single cycle. Referring to the example shown in FIG. 5, the contentions happen during 0°-45° and 180°-225° phase—represented by the rectangles labelled as (7).

Even though the tristate inverters 202*c* and 202*d* are controlled by complement thermometer code ctrl and ctrlb, the cross contention between the odd and even tristate inverters is still taking place due to the phase difference between the Odd and Even clocks. This contention occurs during the interpolation phase and may last for a total of 2×45°=90° (¼ cycle). This short circuit current is of concern when the inverters are both half-enabled. During the worst case scenario, the average current may be up to 72% higher.

To support a reasonable DCC range (e.g. ⅛ cycle), DCA 203 with at least three CMOS stages is used. This additional cell delay is about 2× of desired DCC range i.e. ¼ cycle or 0.5 UI, and directly taxes onto the CDR loop latency.

The granularity of phase shift is desired to be linear to the thermometer code. In other words, the mixers 202*c/d* should have low differential non-linearity (DNL) and integral non-linearity (INL). Here, DNL represents the deviation of actual phase shift increment from the ideal phase shift increment, while INL represents the deviation between actual phase shift and the ideal phase shift. The architecture of FIG. 2 has DNL up to 2.48 of one LSB step and close to 10° or 7 ps in INL.

Duty cycle correction is realized by adjusting the drive strength for one of the transition edges. However, the correction range of architecture 200 is sensitive to PVT (process, voltage, and temperature) variation. In this regard, the supported DCC range at slow and fast process corners can be different by up to 2.5×. This may restrict the design space between min-delay at slow corner and the DCC range at the fast corner. Further, the short circuit current over the PI mixers 202*c/d* as well as the slow slope on DCA stages 203*a/b/c* increase the risk of circuit failure due to aging stress.

Figure 6:
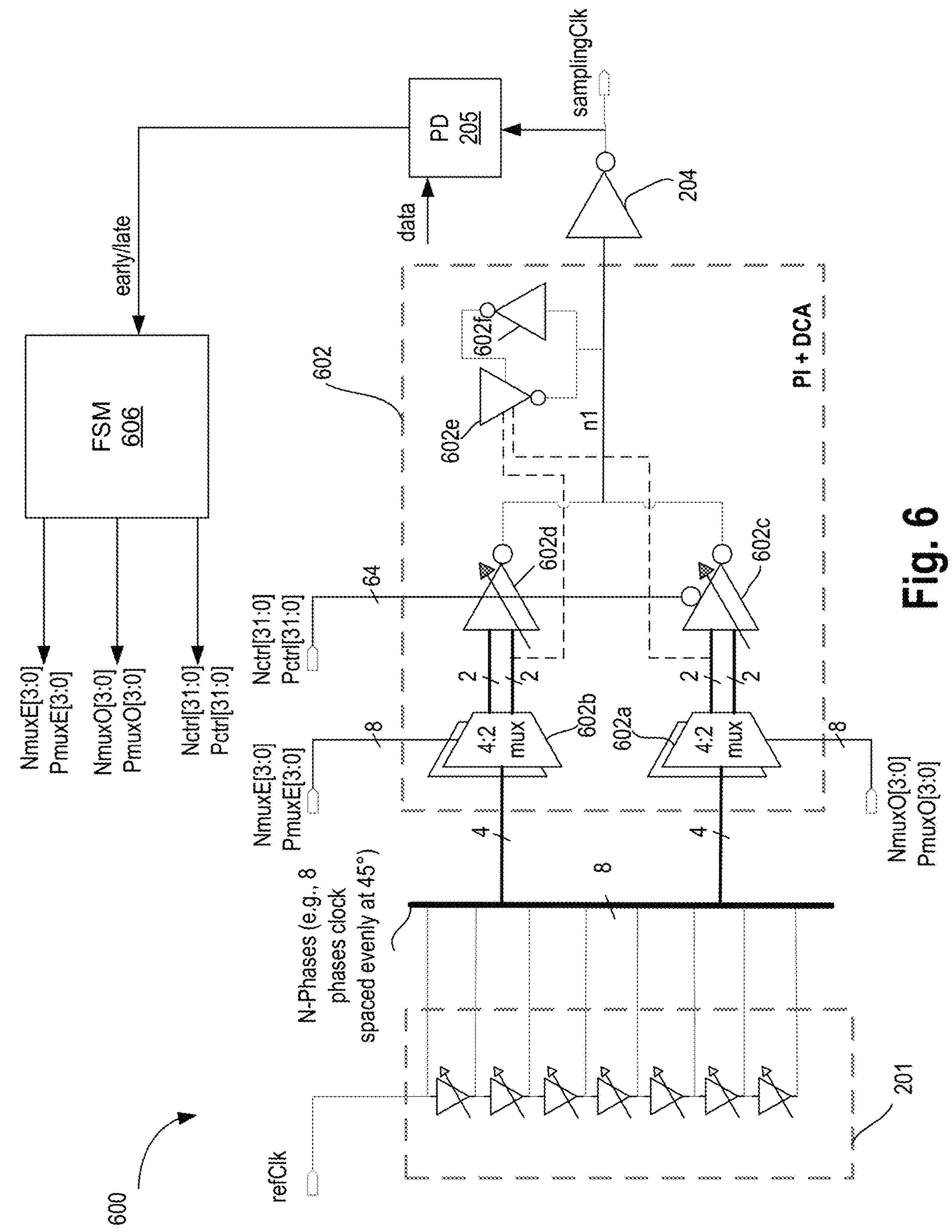
FIG. 6 illustrates a schematic of a low power CDR with fully integrated PI and DCC functions, in accordance with some embodiments.

FIG. 6 illustrates a schematic 600 of a low power CDR with fully integrated PI and DCC functions, in accordance with some embodiments. To mitigate some of the high power, high latency, high DNL and INL, narrow DCC range, and reliability issues from short circuit current, phase interpolation and duty cycle adjustment functions are integrated together. The integrated phase interpolation and duty cycle adjustment functions prevent cross contention between the tristate inverter pair. In various embodiments, the control code for PMOS and NMOS network in the PI mixers are decoupled, and DCC mechanism are blended in the PI mixer code decoding scheme to enable a low latency phase interpolation and duty cycle correction.

In some embodiments, PI 202 and DCA 203 are replaced with integrated PI and DCA 602 (hereinafter circuitry 602). Circuitry 602 comprises multiplexers 602*a* (for even path) and 602*b* (or odd path), slope or delay adjustable drivers 602*c* and 602*d*, and keeper gates 602*e* and 602*f* coupled together as shown. In some embodiments, the slope or delay adjustable drivers 602*c* and 602*d* are implemented as a pair of tristate inverter with three transistors in a stack between ground and supply nodes as described with reference to FIG. 8A. Referring back to FIG. 6, in some embodiments, for lower power design, the three-transistor stack can be replaced with two-transistor stack combined with a transmission gate as described with reference to FIG. 9. Referring back to FIG. 6, in some embodiments, the function of the keeper gates 602*e* and 602*f* can be implemented by circuitry of FIG. 8B.

Referring back to FIG. 6, in some embodiments, circuitry 602, the integration of DCC feature into the PI mixer is performed by decoupling the pull-up and pull-down network of the tristate buffers and controlling the pull-up and pull-down networks by different set of clocks and mixer codes. In some embodiments, FSM 606 is provided to implement a decoding scheme to provide the appropriate mixer codes-Nctrl and PCtrl. The Nctrl code controls the pull-down network while the PCtrl code controls the pull-up network of the PI mixers 602*c* and 602*d*. In this example, 32-bit codes are used for Nctrl and PCtrl. FSM 606 also provides the selection codes (e.g., NnuxE, PmuxE, NmuxO, and PnuxO) for muxes 602*a* and 602*b*. The suffix 'E' and 'O' indicate even and odd, respectively, while prefix 'N' and 'P' indicate selection codes for pull-down and pull-up devices of the mixers. In this example, 4-bit codes are used for the multiplexer selection codes. In some embodiments, outputs of odd muxes 602*a* are clock phases that are used to control the pull-up and pull-down networks of mixer 602*c*. In some embodiments, outputs of even muxes 602*b* are clock phases that are used to control the pull-up and pull-down networks of mixer 602*d*.

The mixer codes combines the PI and DCC codes. The pull-down network drives the fixed edge, which is controlled solely by the PI code, while pull-up network which drives the adjustable edge for DCC, is controlled by sum of PI and DCC code. In some embodiments, the DCC code is in 2's complement form. Other forms of encoding may also be used. The functions of the PD 205 and FSM 606 are otherwise generally same, other than the decoding scheme by FSM 606 that results in the various advantages discussed herein.

Figure 7:
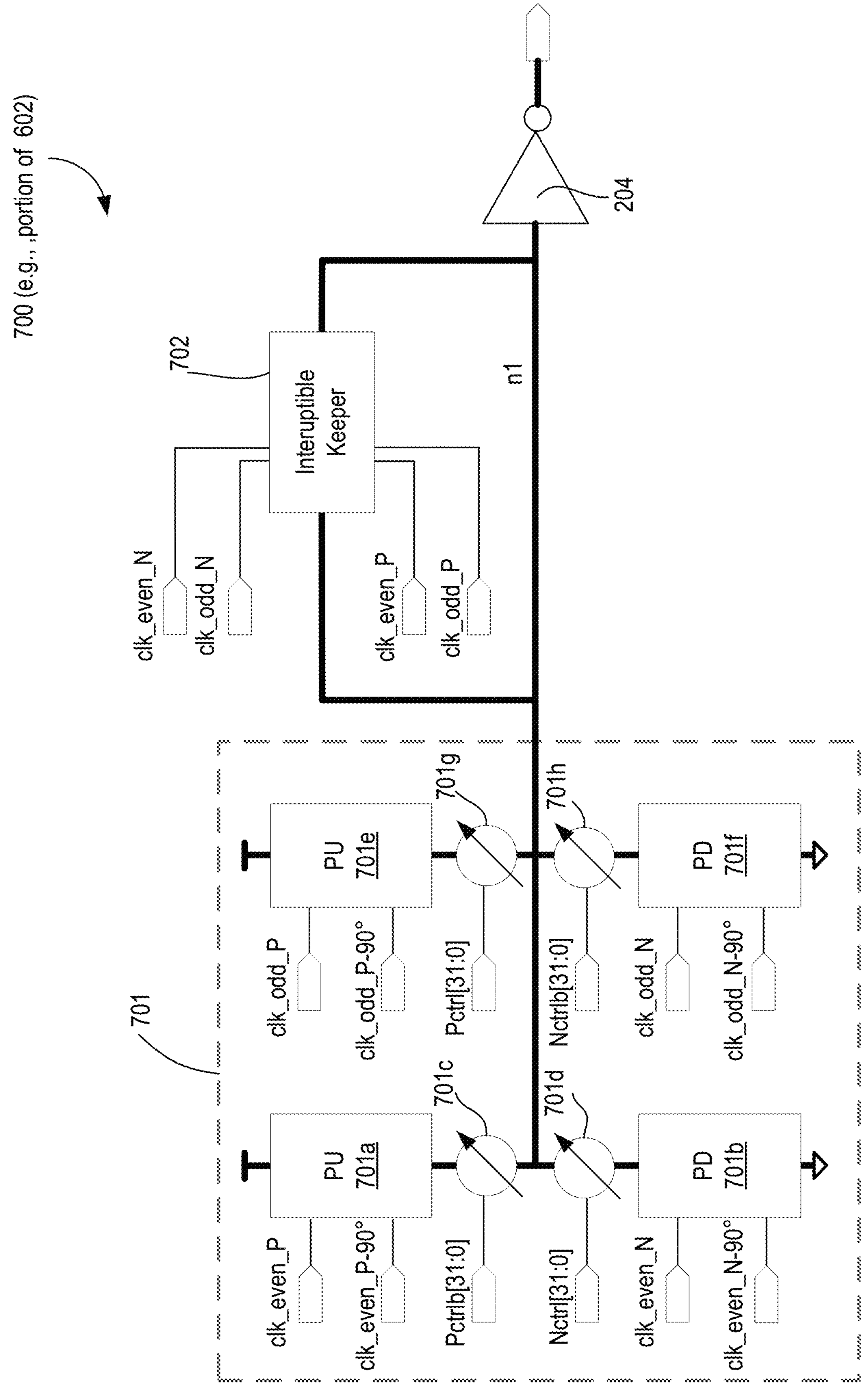
FIG. 7 illustrates a functional schematic of the fully integrated PI and DCC functions, in accordance with some embodiments.

FIG. 7 illustrates a functional schematic 700 of the fully integrated PI and DCC functions, in accordance with some embodiments. The functional schematic 700 comprises the functional circuitry of the integrated PI and DCC functions as indicated by dotted box 701 and keeper 702. The pull-up and pull-down functions of the integrated PI and DCC circuitry 701 include the even pull-up network 701_a_, even pull-down network 701_b_, first even resistive device 701_c_, second even resistive device 701_d_, odd pull-up network 701_e_, and even pull-down network 702_f_, first odd resistive device 701_g_, and second odd resistive device 701_h_.

The even pull-up network 701_a_ is controlled by even clocks (clk_even_P and clk_even_P-90) that are phase shifted by 90 degrees relative to one another. These clocks are provided by muxes 602_b_. The odd pull-up network 701_e_ is controlled by odd clocks (clk_odd_P and clk_odd_P-90) that are phase shifted by 90 degrees relative to one another. These clocks are provided by muxes 602_b_. For example, if the clk_even_P is 1350 phase shifted, the additional series transistor in the pull-up network 701_a_ is to be controlled by clock with 135°-90°=45° phase shift.

The even pull-down network 701_b_ is controlled by even clocks (clk_even_N and clk_even_N-90) that are phase shifted by 90 degrees relative to one another. These clocks are provided by muxes 602_a_. The odd pull-down network 702_f_ is controlled by odd clocks (clk_odd_N and clk_odd_N-90) that are phase shifted by 90 degrees relative to one another. These clocks are provided by muxes 602_a_. The even pull-up network 701_a_ is also coupled to another set of pull-up devices 701_c_ (first even resistive devices) that are controlled by Pctrlb provided by the FSM 606. These set of pull-up device 701_c_ have adjustable resistance controllable by Pctrlb code. The odd pull-up network 701_c_ is also coupled to another set of pull-up devices 701_g_ (first odd resistive devices) that are controlled by Pctrl provided by the FSM 606, where Petrlb is an inverse of Pctrl. These set of pull-up device 701_g_ have adjustable resistance controllable by Pctrl code.

The even pull-down network 701_b_ is also coupled to another set of pull-down devices 701_d_ (second even resistive devices) that are controlled by Nctrl provided by the FSM 606. These set of pull-down device 701_d_ have adjustable resistance controllable by Nctrlb code. The odd pull-down network 701_f_ is also coupled to another set of pull-up devices 701_h_ (second odd resistive devices) that are controlled by Nctrlb provided by the FSM 606, where Nctrlb is an inverse of Nctrl. These set of pull-down devices 701_h_ have adjustable resistance controllable by Nctrlb code.

With this arrangement, the effective active phase of either pull-up or the pull-down network are reduced from ½ cycle to ¼ cycle. This helps to get rid of the cross contention issue observed with the embodiment of FIG. 2. Due to the shortening of the effective active phase, the internal node n1 may not be driven for a total of ¼ clock phase. This float condition is prevented by introducing a weak interruptible keeper 702, in accordance with various embodiments.

Figure 8B:
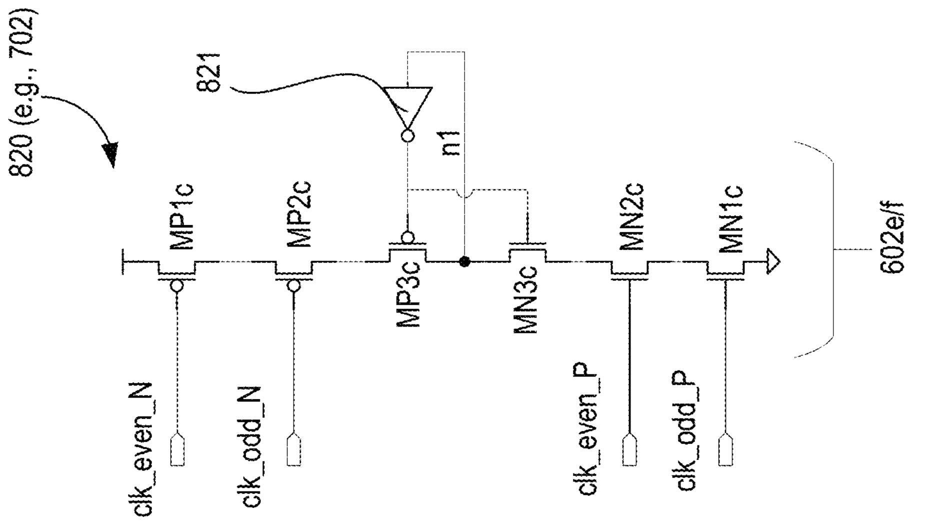
FIGS. 8A-B illustrate an even and odd PI circuitry with DCC function, and interruptible keeper for DCC, respectively, in accordance with some embodiments.
Figure 8A:
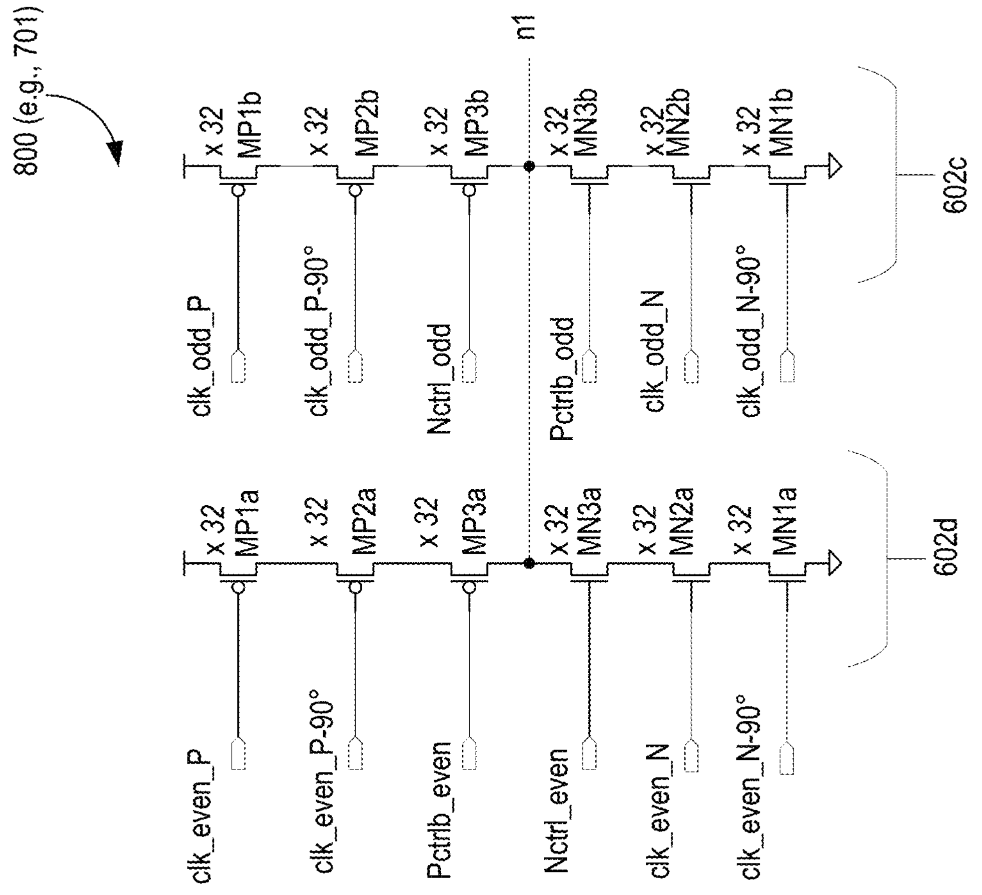

FIGS. 8A-B illustrate even and odd PI circuitries 800 with DCC function, and interruptible keeper 820, respectively, in accordance with some embodiments. In some embodiments, the PI and DCC functions are performed by a stack of 6 transistors. Here, for the even mode, the PI mixer and DCA stack comprises p-type transistors MP1_a_, MP2_a_, and MP3_a_, and n-type transistors MN1_a_, MN2_a_, and MN3_a_. Transistors MP1_a_ and MP2_a_ form the pull-up network 701_a_ while transistors MN1_a_ and MN2_a_ form the pull-down network 701_b_. In these respective networks, the transistors are connected in series and controlled by corresponding clock but with −90° phase shift. Transistors MP3_a_ and MN3_a_ are controlled by the codes that combine the PI and DCC functions. These codes (Pctrl and Nctrl, and their complementary codes Pctrlb and Nctrlb) are generated by a decoding scheme described with reference to FIG. 10.

Referring back to FIGS. 8A-B, for the odd mode, the PI mixer and DCA stack comprises p-type transistors MP1_b_, MP2_b_, and MP3_b_, and n-type transistors MN1_b_, MN2_b_, and MN3_b_. Transistors MP1_b_ and MP2_b_ form the pull-up network 701_c_ while transistors MN1_b_ and MNba form the pull-down network 702_d_. In these respective networks, the transistors are connected in series and controlled by corresponding clock but with −90° phase shift. Transistors MP3_b_ and MN3_b_ are controlled by the codes that combine the PI and DCC functions.

In some embodiments, keeper circuitry 820 (that implements the function of gates 602_e_ and 602_f_) comprises a similar stack as the PI mixer and DCC stacks 800. In some embodiments, keeper circuitry 820 comprises p-type transistors MP1_c_, MP2_c_, and MP3_c_, n-type transistors MN1_c_, MN2_c_, and MN3_c_, and feedback inverter 821. The input of the feedback inverter 821 is coupled to node n1 (same node of n1 of FIG. 8A) is used to enable or disable the keeper function. Also note, the opposite polarity clock phases are provided to the pull-up and pull-down devices of keeper circuitry 820. For example, clk_even_N and clk_odd_N are provided to p-type devices MP1_c_ and MP2_c_, respectively, while clk_even_P and clk_odd_P are provided to n-type devices MN1_c_ and MN2_c_, respectively.

Since the effective active phase of either pull-up or the pull-down networks of PI mixer and DCC stacks 602_c_ and 602_d_ are reduced from ½ cycle to ¼ cycle, cross contention issue seen by PI mixer stack 202_c/d_ are mitigated. However, as a result of shortening the effective active phase of either pull-up or the pull-down networks, the internal node n1 is not driven for a total of 4 clock phase in the absence of keeper circuitry 820. This float condition is prevented by the weak interruptible keeper 820.

Figure 9:
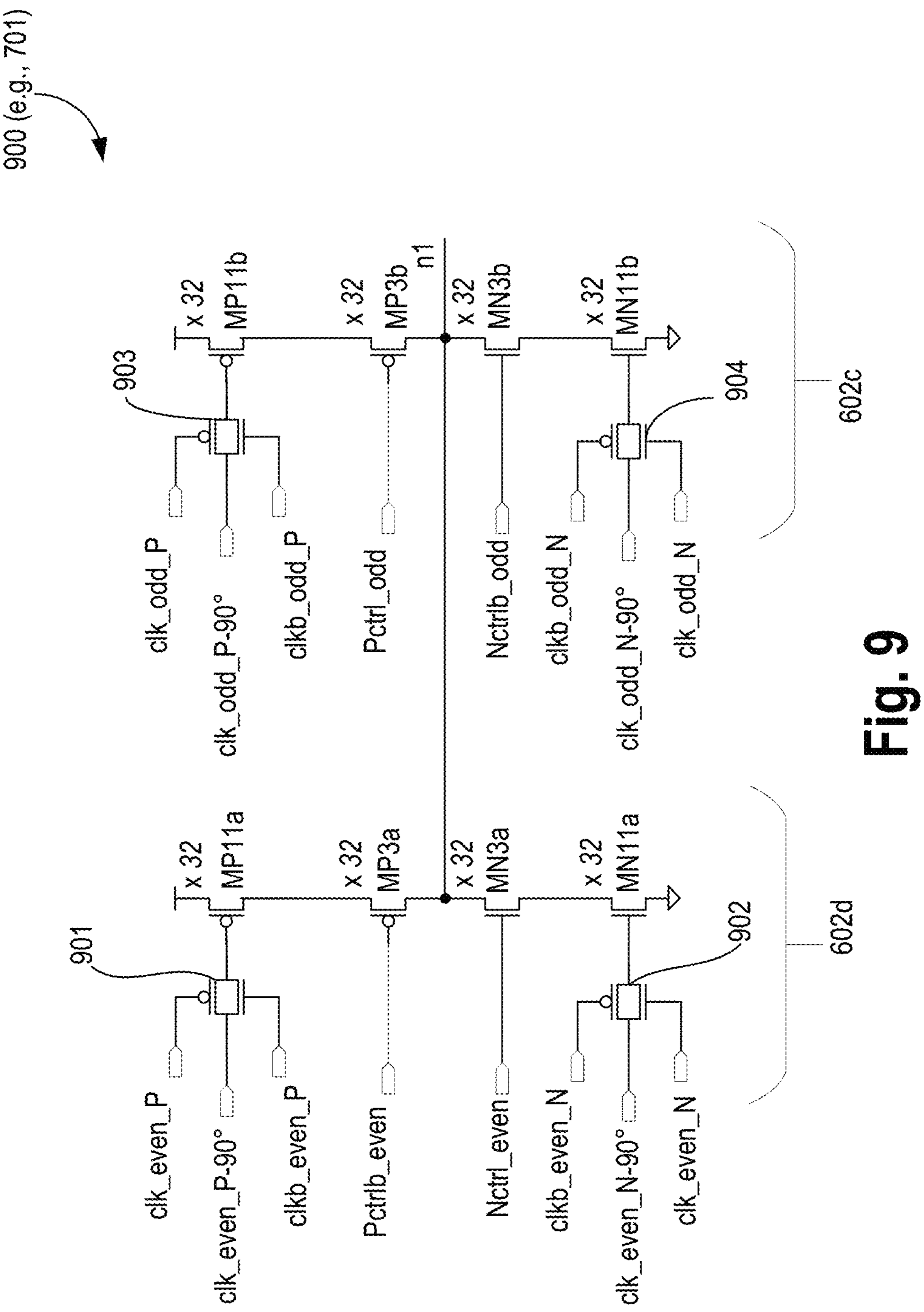
FIG. 9 illustrates an even and odd PI circuitry with DCC function, in accordance with some other embodiments.

FIG. 9 illustrates schematic 900 for even and odd PI circuitry with DCC function, in accordance with some other embodiments. For lower power design, the 6-transistor stacks shown in FIG. 8A of 602_c/d_ can be replaced with a 4-transistor stack (between ground and supply) combined with transmission gates as shown in FIG. 9. In some embodiments, the even pull-up network 701_a_ comprises p-type devices MP11_a_, whose gate is controlled by transmission gate 901. The transistors of transmission gate 901 are controlled by the even clock and it's complementary (clk_even_P and clkb_even_P), and are used to pass on clk_even_P-90 to control the gate of MP11_a_. Here, MP11_a_ has 32 instances coupled together in parallel. In some embodiments, even pull-down network 701_b_ comprises n-type devices MN11_a_, whose gate is controlled by transmission gate 902. The transistors of transmission gate 902 are controlled by the even clock and it's complementary (clk_even_N and clkb_even_N), and are used to pass on clk_even_N-90 to control the gate of MN11_a_. Here, MN11_a_ has 32 instances coupled together in parallel. Transistors MP3_a_ and MN3_a_ are controlled by Pctrlb_even and Nctrl_even just as in FIG. 8A.

Referring back to FIG. 9, in some embodiments, the odd pull-up network 701_c_ comprises p-type devices MP11_b_, whose gate is controlled by transmission gate 903. The transistors of transmission gate 903 are controlled by the odd clock and it's complementary (clk_odd_P and clkb_odd_P), and are used to pass on clk_odd_P-90 to control the gate of MP11_b_. Here, MP11_b_ has 32 instances coupled together in parallel. In some embodiments, odd pull-down network 701_d_ comprises n-type devices MN11_b_, whose gate is controlled by transmission gate 904. The transistors of transmission gate 904 are controlled by the odd clock and it's complementary (clk_odd_N and clkb_odd_N), and are used to pass on clk_odd_N-90 to control the gate of MN11*b*. Here, MN11*a* has 32 instances coupled together in parallel. Transistors MP3*b* and MN3*b* are controlled by Pctrl_odd and Nctrlb_odd just as in FIG. 8A.

Figure 10:
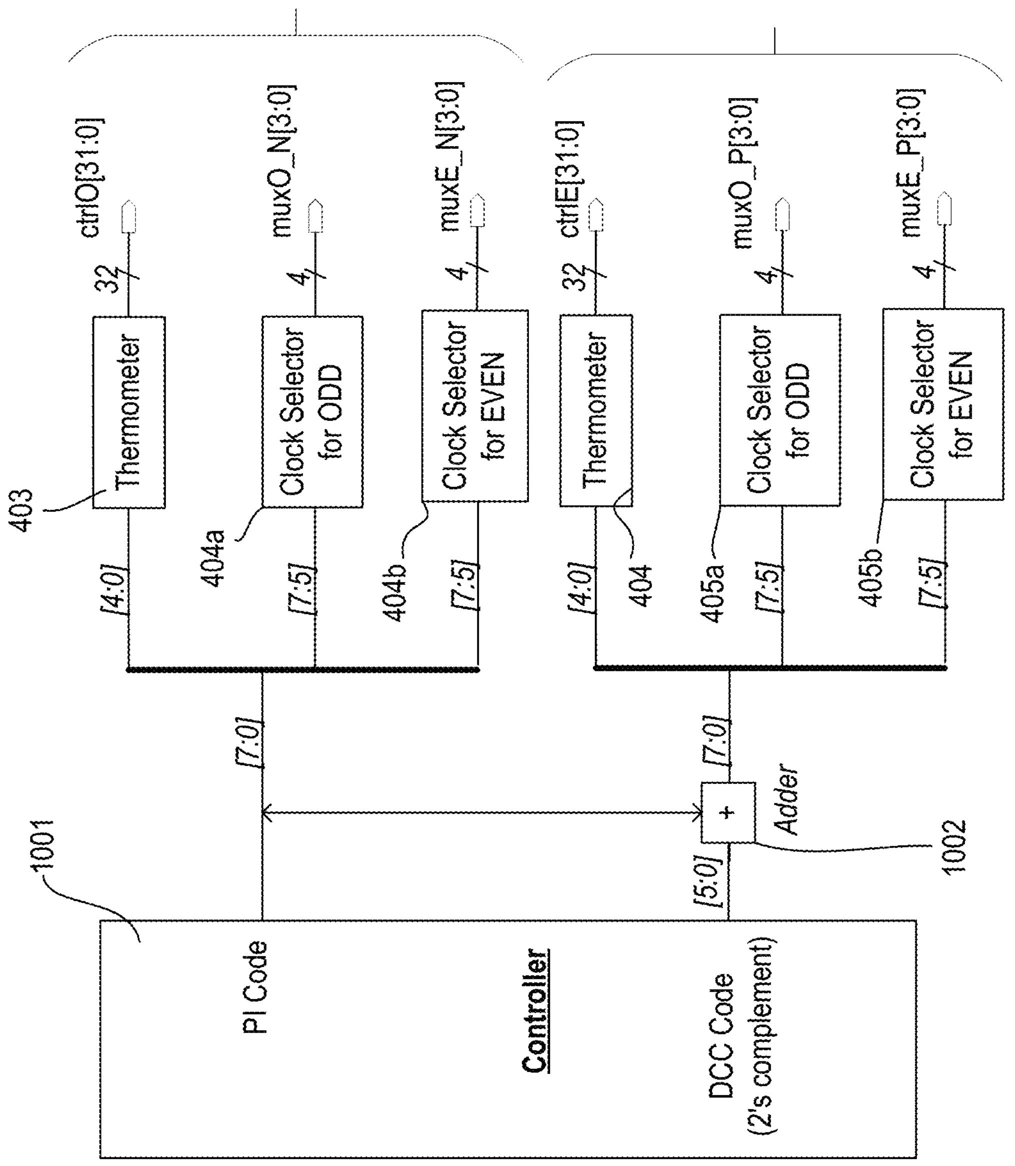
FIG. 10 a portion of a FSM that generates control codes for PI/DCC, and multiplexer(s) of the CDR of FIG. 6, in accordance with some embodiments.

FIG. 10 illustrates a portion 1000 of a FSM that generates control codes for PI/DCC, and multiplexer(s) of the CDR of FIG. 6, in accordance with some embodiments. Portion 1000 comprises controller 1001, adder 1002, thermometer encoders 403 and 404, odd clock selectors 404*a* and 405*b*, and even clock selectors 404*b* and 405*b*. Operation of FIG. 10 is illustrated by FIGS. 11-12.

Figure 11:
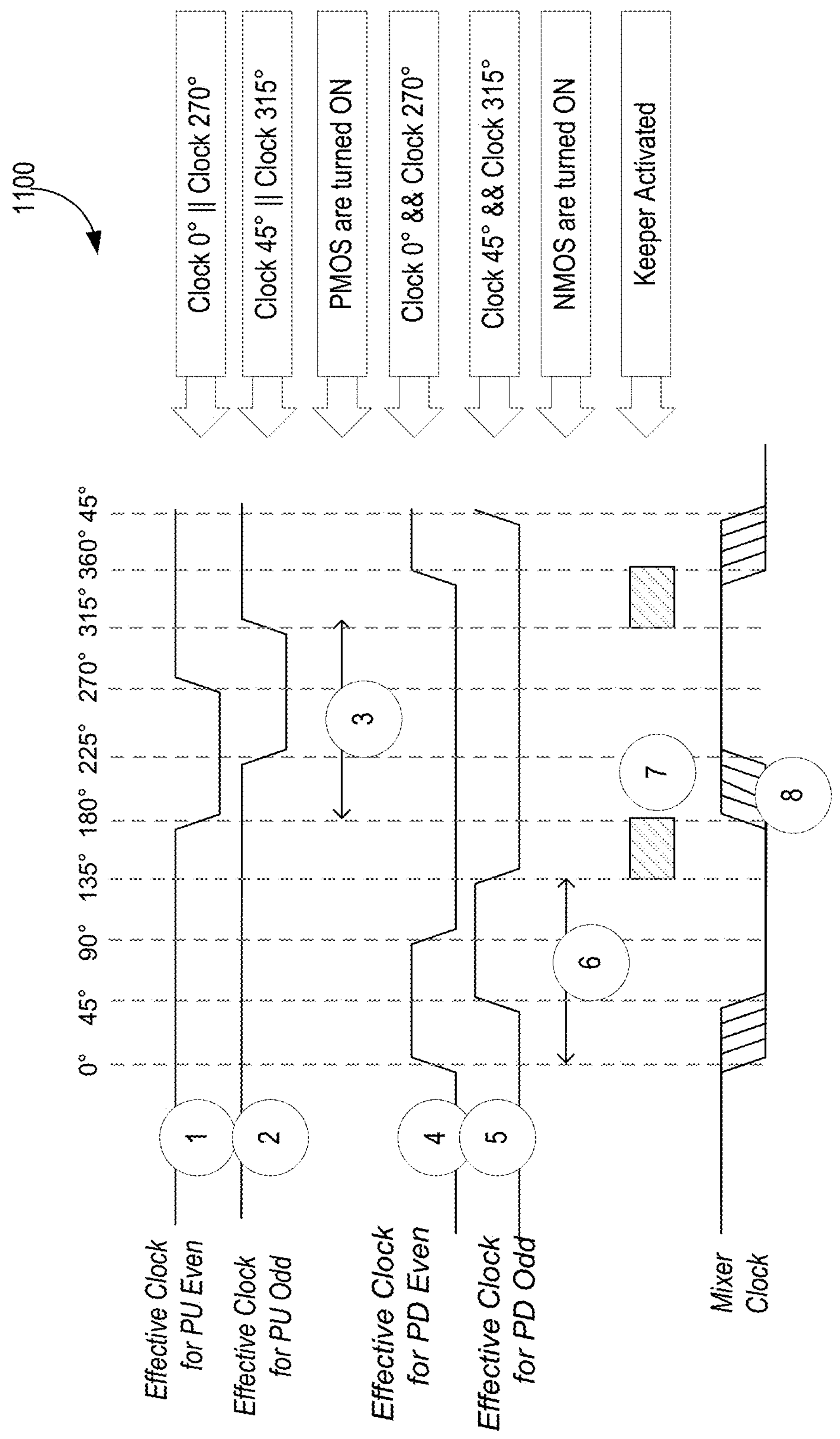
FIG. 11 illustrates a timing diagram for operating CDR of FIG. 6, in accordance with some embodiments.
Figure 12:
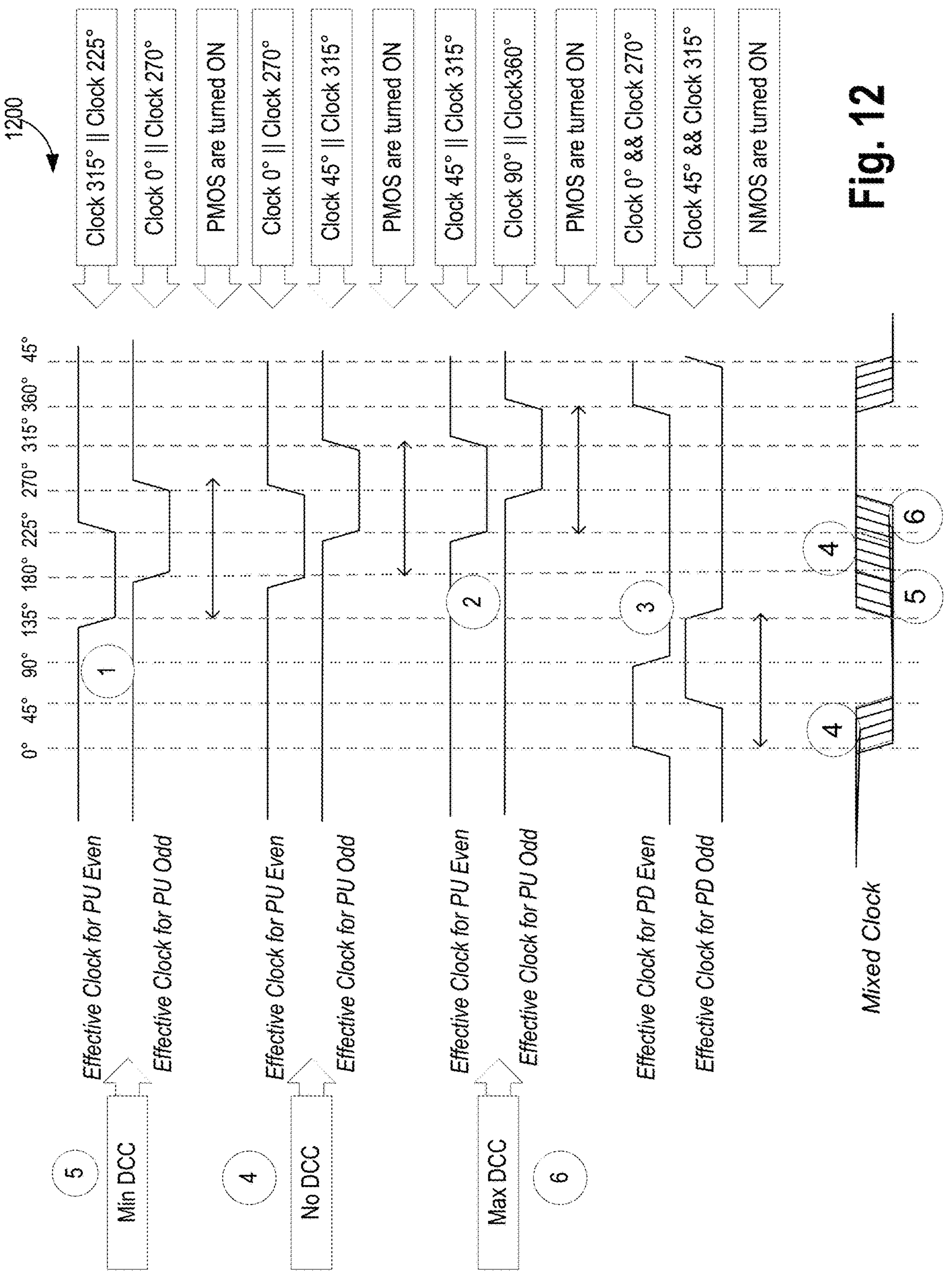
FIG. 12 illustrates a timing diagram for operation CDR of FIG. 6 with PI is operating at minimum code and DCC code is a low code, in accordance with some embodiments.

FIG. 11 illustrates a timing diagram 1100 for operating CDR of FIG. 6, in accordance with some embodiments. Timing diagram 1100 shows the baseline scenario in which there is no DC correction i.e. DCC code=0. In this case, both P and N networks of the PI mixer receive the same clocks from PI clock multiplexer. The float condition from 1350 to 1800 and 3150 to 3600 are prevented by enabling the interruptible keeper 702/820.

At label 1, the series p-type devices (e.g., MP1*a*, MP2*a*) in the even pull-up network is driven by clock 0 and clock 270, respectively. The effective clock is clock 90 instead of clock 180. At label 2, the series p-type devices (e.g., MP1*b* and MP2*b*) in the odd pull-up network are driven by clock 45 and clock 315. The effective clock is 90 instead of 180. At label 3, at least one p-type device in the pull-up network is turned on allowing the mixer node n1 to be pulled-up to logic 1.

At label 4, the series n-type devices (e.g., MN1*a*, MN2*a*) in the even pull-down network is driven by clock 0 and clock 270, respectively. The effective clock is clock 90 instead of clock 180. At label 5, the series n-type devices (e.g., MN1*b* and MN2*b*) in the odd pull-down network are driven by clock 0 and clock 270. The effective clock is 90 instead of 180. At label 6, at least one n-type device in the pull-down network is turned on allowing the mixer node n1 to be pulled-down to logic 0.

In some embodiments, the pull-down networks of keeper are enabled from 1350 to 1800 to hold the internal node n1 to VSS. Meanwhile, the pull-up networks of the keeper 702/820 are enabled from 3150 to 3600 to hold the internal node n1 to VCC as shown in label (7). At label 7, both pull-up and pull-down networks are turned off which causes node n1 to float and the keeper 820 to be enabled. At label 8, the clock phase of both rising and falling transitions at the mixer node n1 can be fine-tuned based on the PI control code.

There are two extreme cases where (a) the PI mixer is locked in minimum code and DCC is at the most negative code (−32); (b) the PI mixer is locked in maximum code and DCC is at the most positive code (+31). Note that, in contrast to architecture of FIG. 2, the Pull-up and Pull-down network of the mixer can be connected to different clock sources. For example, if the fixed edge is generated from 0° and 45° clocks, the adjustable edge can be generated from either (i) 315° and 0°, (ii) 0° and 45°, (iii) 45° and 90°.

FIG. 12 illustrates timing diagram 1200 for operation CDR of FIG. 6 with PI is operating at minimum code and DCC code is a low code, in accordance with some embodiments.

At label 1, assuming PI is locked at a minimum code while DCC code=−32 (minimum), PI code that goes into PU network is deducted by 32. As PI is locked, the MuxE_PD and MuxO_PD selection codes remain the same and Clock 0° and 45° are selected. At label 1, MuxE_PU continues to select Clock 0°, while MuxO_PU switches from Clock 45° to Clock 315°. This allows the mixer node n1 to rise earlier up to 45° in phase.

At label 2, assuming PI is locked at a maximum code while DCC code=31 (maximum), PI code that goes into PU network is increased by 31. As PI is locked, the MuxE_PD and MuxO_PD selection codes remain same and Clock 0° and 45° are selected. MuxE_PU continues to select Clock 0°, while MuxO_PU switches from Clock 45° to Clock 135°. This allows the mixer node n1 to rise slower up to 45° in phase.

At label 3, PI code for PD is not incorporated into the DCC code. So, all controls and clocks for the PD network remain the same (e.g., locked at corresponding PI code). At label 4, the PU network controls the fixed edge. The edge sticks to the phase-shift indicated by the PI code. At label 5, the mixer node n1 rises up to 45° in phase earlier. This allows the DCC of up to −45°. At label 6, mixer node to rise up to 45° in phase later. This allows the DCC of up to +45°.

Figure 13:
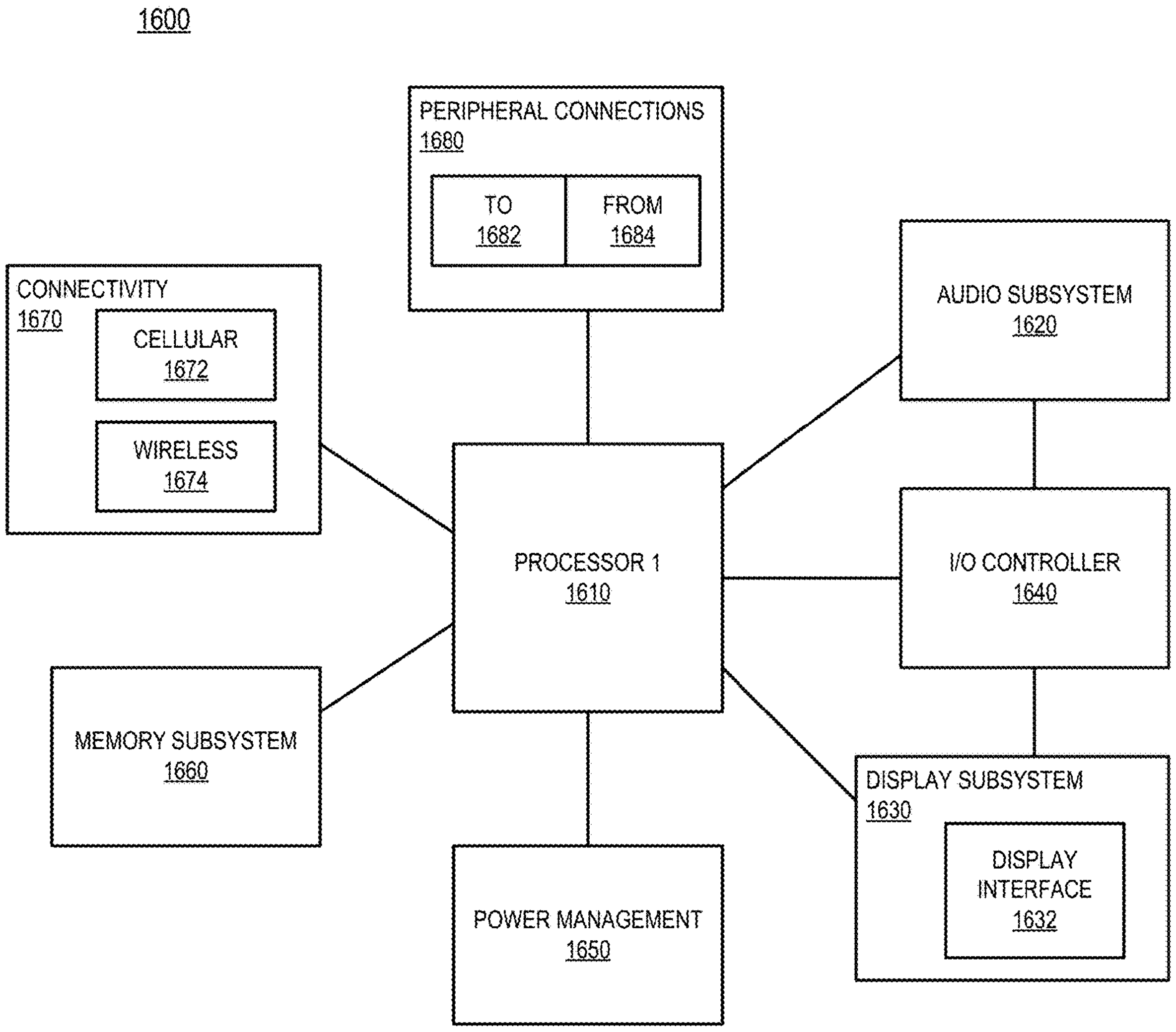
FIG. 13 illustrates a smart device or a computer system or a SoC (System-on-Chip) with a high-speed low power PI with DCC, according to some embodiments of the disclosure.

FIG. 13 illustrates a smart device or a computer system or a SoC (System-on-Chip) with clock data recovery circuitry including the high-speed low power PI with DCC, according to some embodiments of the disclosure.

FIG. 13 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with high-speed low power PI with DCC (e.g., architecture of FIG. 6), according to some embodiments discussed. Other blocks of the computing device 1600 may also include high-speed low power PI with DCC (e.g., architecture of FIG. 6), according to some embodiments.

The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
- a delay line to generate a plurality of clock phases of a reference clock;
- a phase interpolator with integrated duty cycle correction, the phase interpolator to receive the plurality of clock phases and to generate a sampling clock based on the plurality of clock phases;
- a phase detector to generate an early or late indicator according to a phase difference between the sampling clock and a data signal; and
- a control circuit to generate control signals for the phase interpolator based on the early or late indicator.

2. The apparatus of claim 1, wherein the phase interpolator includes a first mixer and a second mixer with respective outputs coupled to a same node, wherein at least one of the first mixer or second mixer includes a pull-up network and a pull-down network, and wherein the control signals include a first control signal to control the pull-up network and a second control signal to control the pull-down network.

3. The apparatus of claim 2, wherein the phase interpolator further includes:
- a first set of multiplexers to receive odd clock phases of the plurality of clock phases, wherein an output of the first set of multiplexers is coupled to an input of the first mixer; and
- a second set of multiplexers to receive even clock phases of the plurality of clock phases, wherein an output of the second set of multiplexers is coupled to an input of the second mixer.

4. The apparatus of claim 3, wherein the control signals include a first set of multiplexer control signals to control the first set of multiplexers and a second set of multiplexer control signals to control the second set of multiplexers.

5. The apparatus of claim 3, wherein the first set of multiplexers includes:
- a first 4:2 multiplexer that selectively provides a first set of even clock phases separated by 90 degrees from one another; and
- a second 4:2 multiplexer that selectively provides a second set of even clock phases separated by 90 degrees from one another.

6. The apparatus of claim 2, wherein the phase interpolator further includes keeper circuitry coupled to the node.

7. The apparatus of claim 2, wherein the pull-down network includes:
- a first n-type transistor coupled to a ground supply node and controllable by a first clock phase of the plurality of clock phases;
- a second n-type transistor coupled in series with the first n-type transistor, wherein the second n-type transistor is controllable by a second clock phase of the plurality of clock phases; and
- a third n-type transistor coupled in series between the second n-type transistor and the node, wherein the third n-type transistor is controlled by the second control signal.

8. The apparatus of claim 1, wherein the control circuit is a finite state machine.

9. A phase interpolator circuit comprising:
- a first mixer controllable by a first code; and
- a second mixer controllable by a second code, wherein the first and second mixers are tri-stateable based on the respective first and second codes, wherein outputs of the first and second mixers are coupled to a node, and wherein at least one of the first or second mixers includes:
  - a pull-up transistor; and
  - a transmission gate coupled to a gate terminal of the pull-up transistor, wherein the transmission gate is controllable by a first phase of a clock signal and is to pass a second phase of the clock signal to the gate terminal of the pull-up transistor.

10. The phase interpolator circuit of claim 9, wherein the pull-up transistor is a first pull-up transistor, and wherein the at least one of the first or second mixers further includes a second pull-up transistor to receive the first phase of the clock signal.

11. The phase interpolator circuit of claim 9, wherein the first and second pull-up transistors are included in a pull-up network, and wherein the phase interpolator circuit further includes:
- a pull-down network;
- a first resistive device coupled in series with the pull-up network and the node; and
- a second resistive device coupled in series with the pull-down network and the node.

12. The phase interpolator circuit of claim 11, wherein the pull-down network comprises:

a first pull-down transistor controllable by a third phase of the clock signal; and a second pull-down transistor coupled in series with the first n-type device, wherein the second n-type device is controllable by a fourth phase of the clock signal.

13. The phase interpolator of claim 11, wherein the first resistive device includes a p-type device, and wherein the second resistive device includes an n-type device.

14. The phase interpolator circuit of claim 11, wherein the transmission gate is a first transmission gate, and wherein the pull-down network comprises:

a pull-down transistor; and a second transmission gate coupled to a gate of the pull-down transistor, wherein the second transmission gate is controllable by a third phase of the clock signal, and wherein the second transmission gate is to provide the n-type device with a fourth phase of the clock signal.

15. The phase interpolator circuit of claim 9, further comprising keeper circuitry coupled to the node.

16. The phase interpolator of claim 15, wherein the keeper circuitry comprises:

a first inverter having an input coupled to the node; and a second inverter having an input coupled to an output of the first inverter, wherein an output of the second inverter is coupled to the node.

17. The phase interpolator circuit of claim 9, wherein the first and second phases of the clock signal are separated by 90 degrees.

18. A computer system comprising:

a communication interface to receive a data signal; and a clock data recovery (CDR) circuit coupled to the communication interface, the CDR circuit including:

a delay line to generate a plurality of clock phases of a reference clock;

a phase interpolator with integrated duty cycle correction, the phase interpolator to receive the plurality of clock phases and to generate a sampling clock;

a phase detector to generate an early or late indicator according to a phase difference between the sampling clock and the data signal; and a control circuit to generate control signals for the phase interpolator based on the early or late indicator.

19. The computer system of claim 18, wherein the phase interpolator includes a first mixer and a second mixer with respective outputs coupled to a same node, wherein the first and second mixers are tri-state mixers, wherein at least one of the first mixer or second mixer includes a pull-up network and a pull-down network, and wherein the control signals include a first control signal to control the pull-up network and a second control signal to control the pull-down network.

20. The computer system of claim 19, wherein the phase interpolator further includes:

a first set of multiplexers to receive odd clock phases of the plurality of clock phases, wherein an output of the first set of multiplexers is coupled to an input of the first mixer; and a second set of multiplexers to receive even clock phases of the plurality of clock phases, wherein an output of the second set of multiplexers is coupled to an input of the second mixer.

21. The computer system of claim 20, wherein the control signals include a first set of multiplexer control signals to control the first set of multiplexers and a second set of multiplexer control signals to control the second set of multiplexers.

22. The computer system of claim 20, wherein the first set of multiplexers includes:

a first 4:2 multiplexer that selectively provides a first set of even clock phases separated by 90 degrees from one another; and a second 4:2 multiplexer that selectively provides a second set of even clock phases separated by 90 degrees from one another.

23. The computer system of claim 19, wherein the phase interpolator further includes keeper circuitry coupled to the node.

24. The computer system of claim 19, wherein the pull-down network includes:

a first n-type transistor coupled to a ground supply node and controllable by a first clock phase of the plurality of clock phases;

a second n-type transistor coupled in series with the first n-type transistor, wherein the second n-type transistor is controllable by a second clock phase of the plurality of clock phases; and a third n-type transistor coupled in series between the second n-type transistor and the node, wherein the third n-type transistor is controlled by the second control signal.

25. The computer system of claim 19, wherein the control circuit is a finite state machine.

* * * * *